(12) United States Patent
Chiang et al.

(10) Patent No.: US 11,935,854 B2
(45) Date of Patent: Mar. 19, 2024

(54) METHOD FOR FORMING BONDED SEMICONDUCTOR STRUCTURE UTILIZING CONCAVE/CONVEX PROFILE DESIGN FOR BONDING PADS

(71) Applicant: UNITED MICROELECTRONICS CORP., Hsin-Chu (TW)

(72) Inventors: Chung-Sung Chiang, Kaohsiung (TW); Chia-Wei Liu, Tainan (TW); Yu-Ruei Chen, New Taipei (TW); Yu-Hsiang Lin, New Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/119,266

(22) Filed: Mar. 8, 2023

(65) Prior Publication Data

US 2023/0223366 A1    Jul. 13, 2023

Related U.S. Application Data

(62) Division of application No. 17/406,091, filed on Aug. 19, 2021, now Pat. No. 11,640,949.

(30) Foreign Application Priority Data

Jul. 9, 2021 (CN) .......................... 202110776523.5

(51) Int. Cl.
*H01L 23/00* (2006.01)
*H01L 23/488* (2006.01)
*H01L 23/532* (2006.01)
*H01L 25/065* (2023.01)

(52) U.S. Cl.
CPC ............ *H01L 24/06* (2013.01); *H01L 23/488* (2013.01); *H01L 23/53228* (2013.01); *H01L 25/0655* (2013.01)

(58) Field of Classification Search
CPC . H01L 24/06; H01L 23/488; H01L 23/53228; H01L 25/0655; H01L 25/0657
USPC .................. 257/782; 438/118, 617, 612, 666
See application file for complete search history.

(56) References Cited

U.S. PATENT DOCUMENTS

| | | |
|---|---|---|
| 6,258,625 B1 | 7/2001 | Brofman |
| 8,802,538 B1 | 8/2014 | Liu |
| 9,520,361 B2 | 12/2016 | Kang |
| 9,640,509 B1 | 5/2017 | Yang |
| 10,319,701 B2 | 6/2019 | Yu |

(Continued)

*Primary Examiner* — Didarul A Mazumder
(74) *Attorney, Agent, or Firm* — Winston Hsu

(57) ABSTRACT

A method for forming a bonded semiconductor structure is disclosed. A first device wafer having a first bonding layer and a first bonding pad exposed from the first bonding layer and a second device wafer having a second bonding layer and a second bonding pad exposed from the second bonding layer are provided. Following, a portion of the first bonding pad is removed until a sidewall of the first bonding layer is exposed, and a portion of the second bonding layer is removed to expose a sidewall of the second bonding pad. The first device wafer and the second device wafer are then bonded to form a dielectric bonding interface between the first bonding layer and the second bonding layer and a conductive bonding interface between the first bonding pad and the second bonding pad. The conductive bonding interface and the dielectric bonding interface comprise a step-height.

6 Claims, 6 Drawing Sheets

(56) References Cited

U.S. PATENT DOCUMENTS

| | | |
|---|---|---|
| 10,510,597 B2 | 12/2019 | Tseng |
| 10,886,252 B2 | 1/2021 | Peng |
| 2011/0278740 A1* | 11/2011 | Chen .................. H01L 25/0657 |
| | | 257/777 |
| 2016/0268230 A1* | 9/2016 | Lin ......................... H01L 24/08 |
| 2020/0051937 A1* | 2/2020 | Uzoh ...................... H01L 24/03 |
| 2021/0159216 A1* | 5/2021 | Wu ..................... H01L 21/8221 |
| 2021/0343669 A1 | 11/2021 | Jung |
| 2022/0199559 A1 | 6/2022 | Fang |
| 2022/0310580 A1* | 9/2022 | Chiu .................... H01L 23/481 |

* cited by examiner

METHOD FOR FORMING BONDED SEMICONDUCTOR STRUCTURE UTILIZING CONCAVE/CONVEX PROFILE DESIGN FOR BONDING PADS

CROSS REFERENCE TO RELATED APPLICATIONS

This application is a division of U.S. application Ser. No. 17/406,091, filed on Aug. 19, 2021. The content of the application is incorporated herein by reference.

BACKGROUND OF THE INVENTION

1. Field of the Invention

The present invention relates to semiconductor technology, and more particularly to a bonded semiconductor structure and method for forming the same.

2. Description of the Prior Art

A 3D IC refers to a three-dimensional stack of chips formed by using wafer-level bonding and through-silicon-via (TSV) technologies. In comparison with conventional two-dimensional chips, a 3D IC may have the advantages of using the space more effectively, shorter signal transmission distances between chips, and lower interconnecting resistances. 3D ICs have gradually become the mainstream technology of power converters, low noise amplifiers, radio frequency (RF) or millimeter wave (MMW) components. However, current 3D ICs still have problems to be improved, such as abnormal signal transmissions caused by defective bonding between the bonding pads.

SUMMARY OF THE INVENTION

In light of the above, the present invention is directed to provide a bonded semiconductor structure and a manufacturing method for forming the same, which may ensure an intimate contact between the bonded bonding pads of the bonded semiconductor structure by utilizing a concave/convex profile design for the corresponding bonding pads. The stress at the bonding interface may also be reduced.

According to an embodiment of the present invention, a bonded semiconductor structure includes a first device wafer and a second device wafer. The first device includes a first dielectric layer, a first bonding pad disposed in the first dielectric layer, and a first bonding layer on the first dielectric layer. The second device wafer includes a second dielectric layer, a second bonding layer on the second dielectric layer, and a second bonding pad disposed in the second dielectric layer and extending through the second bonding layer and at least a portion of the first bonding layer. A conductive bonding interface between the first bonding pad and the second bonding pad and a dielectric bonding interface between the first bonding layer and the second bonding layer include a step-height.

According to another embodiment of the present invention, a method for forming a bonded semiconductor structure includes the following steps. A first device wafer and a second device wafer are provided, wherein the first device wafer includes a first bonding layer and a first bonding pad exposed from the first bonding layer, the second device wafer includes a second bonding layer and a second bonding pad exposed from the second bonding layer. Following, a portion of the first bonding pad is removed until a sidewall of the first bonding layer is exposed, and a portion of the second bonding layer is removed to expose a sidewall of the second bonding pad. After that, the first device wafer and the second device wafer are bonded to form a dielectric bonding interface between the first bonding layer and the second bonding layer and a conductive bonding interface between the first bonding pad and the second bonding pad, wherein the conductive bonding interface and the dielectric bonding interface comprise a step-height.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
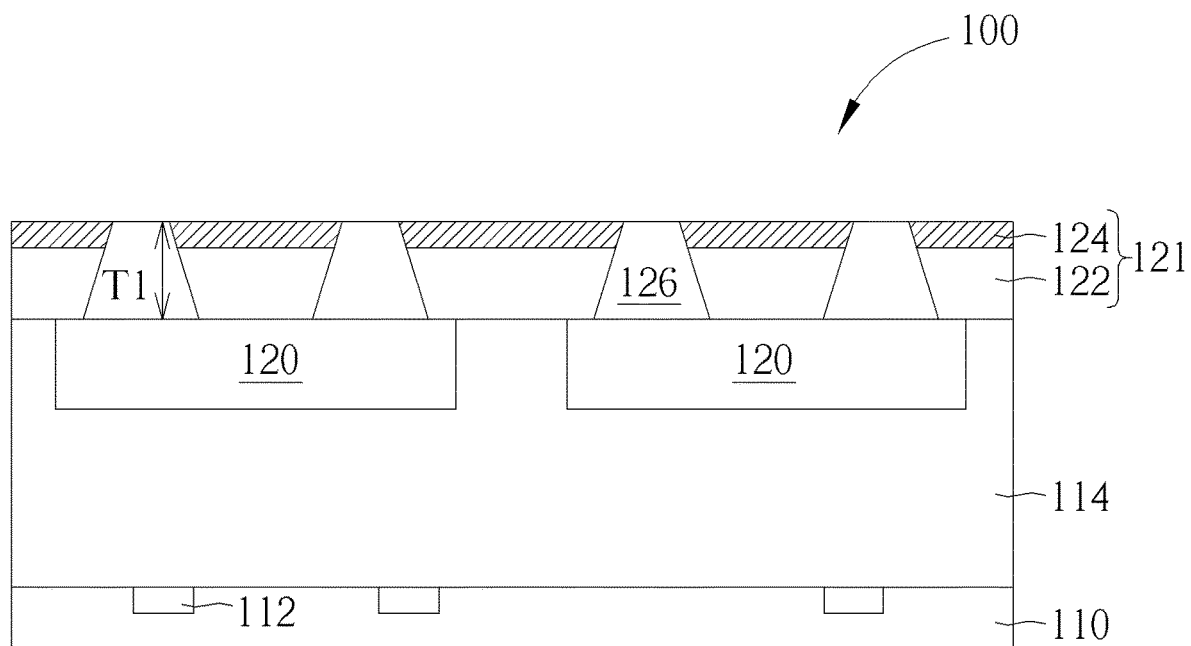
FIG. 1 to FIG. 5 are schematic cross-sectional diagrams illustrating the manufacturing steps of a method for forming a bonded semiconductor structure according to a first embodiment of the present invention.

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

It should be readily understood that the meaning of "on", "above", "over" and the like in the present disclosure should be interpreted in the broadest manner such that these terms not only means "directly on something" but also includes the meaning of "on something with an intermediate feature or a layer therebetween".

Furthermore, spatially relative terms, such as "beneath", "below", "under", "lower", "above", "upper", "on", "over" and the like may be used herein to describe one element or feature's spatial relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 5 are schematic cross-sectional diagrams illustrating the steps of forming a bonded semiconductor structure according to a first embodiment of the present invention. FIG. 6 is a partial enlarged view of the bonded semiconductor structure shown in FIG. 5. Please refer to FIG. 1. A first device wafer 100 is provided. The first device wafer 100 includes a substrate 110, an interconnection layer 114 disposed on the substrate 110, and a first bonding structure layer 121 disposed on the interconnection layer 114. The substrate 110 may be a silicon substrate, a silicon-on-insulator (SOI) substrate, a silicon germanium (SiGe) substrate, a III-V semiconductor substrate, or a substrate made of other suitable semiconductor materials. A plurality of semiconductor devises 112 may be formed in the substrate 110. The semiconductor devises 112 may include transistors, diodes, capacitors, inductors, resistors, and/or any other types of active or passive electrical components, but are not limited thereto. The interconnection layer 114 includes multiple dielectric material layers and a plurality of conductive structures formed in the dielectric material layers. The dielectric material layers of the interconnection layer 114 may include silicon oxide ($SiO_2$), silicon nitride (SiN), silicon oxynitride (SiON), silicon carbonitride (SiCN), nitride doped silicon carbide (NDC), low-k dielectric materials such as fluorinated silica glass (FSG), hydrogenated silicon oxycarbide (SiCOH), spin-on glass, porous low-k dielectric materials, organic polymer dielectric materials, or other suitable dielectric materials. The conductive structures of the interconnection layer 114 are made of metal materials, such as cobalt (Co), copper (Cu), aluminum (Al), tungsten (W), nickel (Ni), platinum (Pt), tantalum (Ta), tantalum nitride (TaN), titanium (Ti), titanium nitride (TiN), a compound of the above materials, a composite layer or an alloy of the above materials, but are not limited thereto. For the sake of simplicity, only the conductive structures 112 in the topmost portion of the interconnection layer 114 are shown in the drawings of the present invention, while other detailed structures of the interconnection layer 114 are not shown. According to an embodiment of the present invention, the conductive structures 112 may include copper (Cu). In some embodiments, the interconnection layer 114 may further include circuit elements such as, but not limited to, capacitors, inductors, resistors, embedded memory, which are not shown for the sake of simplicity.

The first bonding structure layer 121 includes a first dielectric layer 122, a first bonding layer 124 on the first dielectric layer 122, and a plurality of first bonding pads 126 formed in the first bonding layer 124 and the first dielectric layer 122. The top surfaces of the first bonding pads 126 are exposed from the first bonding layer 124. The bottom surfaces of the first bonding pads 126 are in direct contact with the conductive structures 112. The material of the first dielectric layer 122 may be selected from the materials for forming the dielectric material layers of the interconnection layer 114, and will not be repeated herein for the sake of simplicity. According to an embodiment of the present invention, the first dielectric layer 122 may include silicon oxide ($SiO_2$). The first bonding layer 124 may include a dielectric material that may form covalent bonding with another bonding layer of another device wafer through a wafer level bonding process, and may include silicon oxide ($SiO_2$), silicon nitride (SiN), silicon oxynitride (SiON), or silicon carbonitride (SiCN), but is not limited thereto. According to an embodiment of the present invention, the first bonding layer 124 includes silicon carbonitride (SiCN). The first bonding pad 126 may include any conductive metal that may be bonded to another bonding pad of another device wafer through a wafer level bonding process. According to an embodiment of the present invention, the first bonding pads 126 may include copper (Cu). The first bonding structure layer 121 may be formed through the following steps: successively forming the first dielectric layer 122 and the first bonding layer 124 on the interconnection layer 114, performing a patterning process (such as a photolithography-etching process) to form a plurality of openings (not shown) through the first dielectric layer 122 and the first bonding layer 124, depositing a metal layer (such as a copper layer) on the first bonding layer 124 to fill up the openings, and then performing a removal process (such as a chemical mechanical process) to remove the unnecessary portions of the metal layer outside the openings to obtain a first bonding pad 126 in each of the openings.

The shape of the opening may be controlled by adjusting process parameters of the etching process. According to an embodiment of the present invention, the opening may have a trapezoid cross-sectional shape, so that the first bonding pad 126 formed by filling metal in the opening may also have a trapezoid cross-sectional shape. According to an embodiment of the present invention, at this process stage, the first bonding pad 126 may have a thickness T1. The top surface of the first bonding pad 126 is approximately flush with the surface of the first bonding layer 124.

Figure 2:
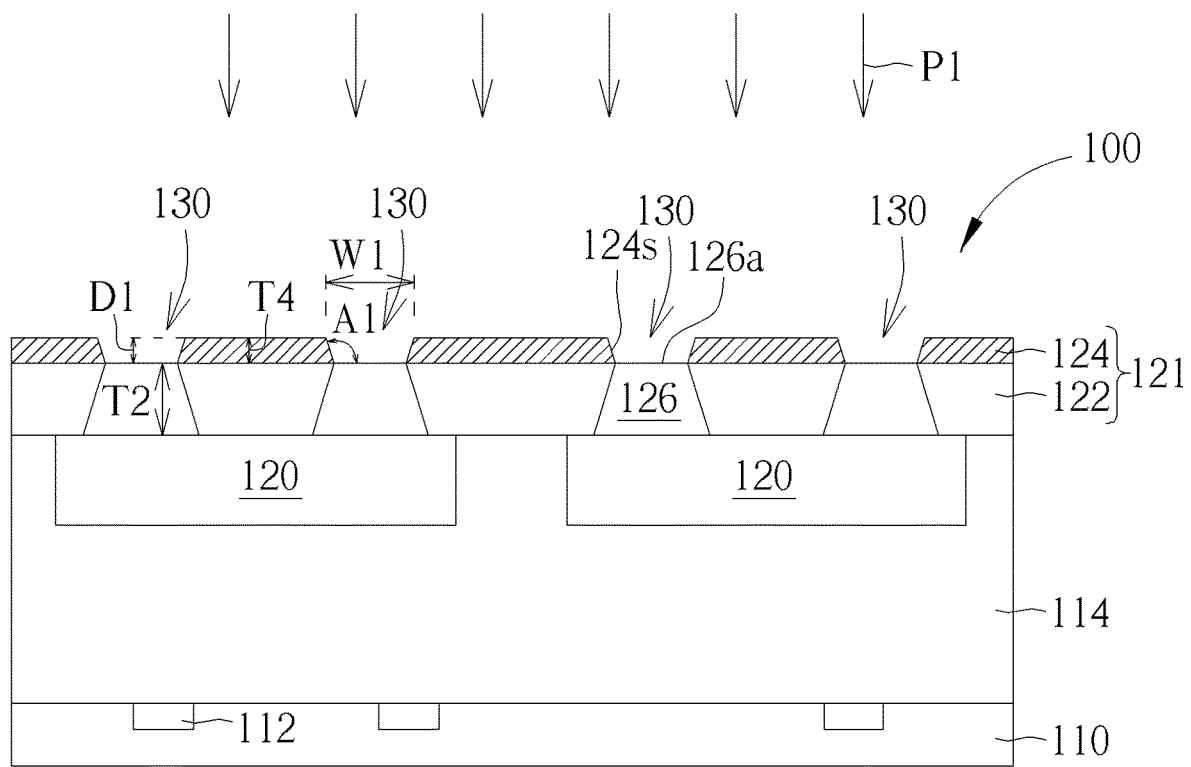

Please refer to FIG. 2. Subsequently, a removal process P1 is performed on the first device wafer 100 to remove portions of the first bonding pads 126, so that a recessed portion 130 having a depth D1 (depth from the surface of the first bonding layer 124) may be formed above each of the first bonding pads 126. A top surface 126a of the first bonding pad 126 lower than the surface of the first bonding layer 124 and a sidewall 124s of the first bonding layer 124 are exposed from the recessed portion 130. The removal process P1 may be a wet etching process, a dry etching process, or a chemical mechanical polishing process that have etching selectivity between the materials of the first bonding pad 126 and the first bonding layer 124. According to an embodiment of the present invention, the removal process P1 may be a continuation of the chemical mechanical polishing process for forming the first bonding pads 126 (the chemical mechanical process to remove the unnecessary portions of the metal layer outside the openings). According to another embodiment of the present invention, removal process P1 may be another chemical mechanical polishing process with increased etching selectivity between the materials of the first bonding pad 126 and the first bonding layer 124. According to an embodiment of the present invention, a portion of the first bonding layer 124 may also be removed during the removal process P1, so that the angle of the sidewall 124s of the first bonding pad 124 or the width of the recessed portion 130 after the removal process P1 may be different from that before the removal process P1. According to an embodiment of the present invention, as shown in FIG. 2, the angle A1 between the sidewall 124s of the first bonding layer 124 and the top surface 126a of the first bonding pad 126 may be larger than 90 degrees. The width W1 of the recessed portion 130 (the width of the recessed portion 130 near the surface of the first bonding layer 124) may be slightly larger than the width of the top surface 126a of the first bonding pad 126. After the removal process P1, the first bonding layer 124 has a thickness T4, and the first bonding pad 126 has a thickness T2. The thickness T2 is smaller than the thickness T1.

Figure 3:
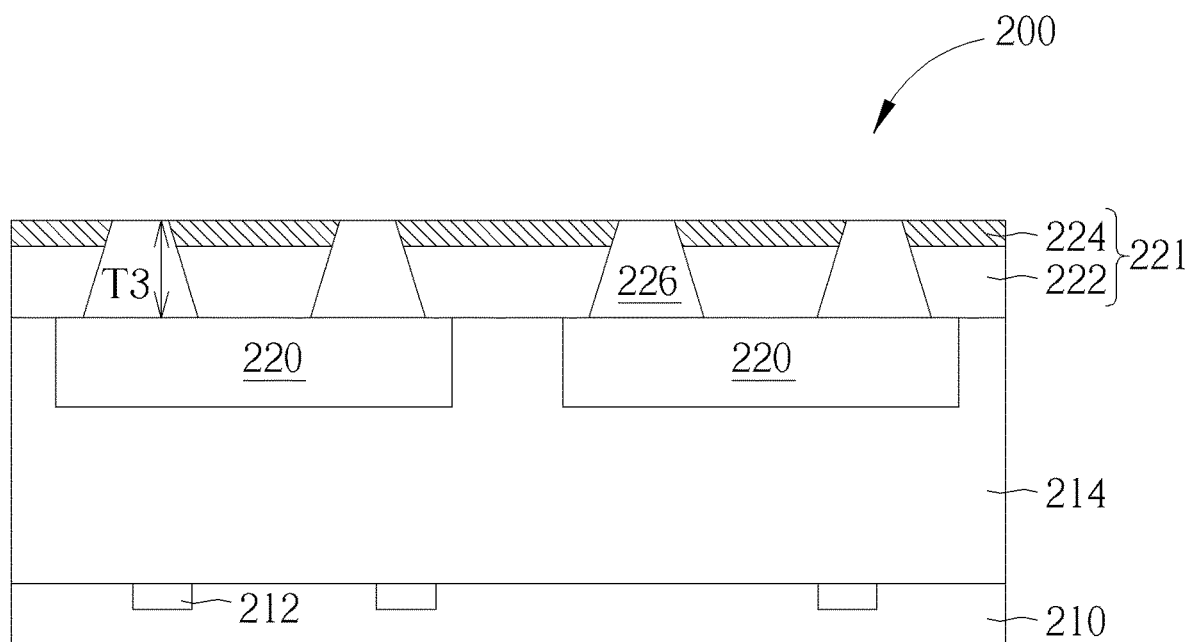

Please refer to FIG. 3. A second device wafer 200 is provided. The second device wafer 200 includes a substrate 210, an interconnection layer 214 disposed on the substrate 210, and a second bonding structure layer 221 disposed on the interconnection layer 214. A plurality of semiconductor devises 212 may be formed in the substrate 210. The semiconductor devises 212 may include transistors, diodes, capacitors, inductors, resistors, and/or any other types of active or passive electrical components, but are not limited thereto. The interconnection layer 214 may include multiple dielectric material layers and a plurality of conductive structures formed in the dielectric material layers. For the sake of simplicity, only the conductive structure 212 in the topmost portion of the interconnection layer 214 is shown in the drawings. In some embodiments, the interconnection layer 214 may include circuit elements such as, but not limited to, capacitors, inductors, resistors, embedded memory, which are not shown for the sake of simplicity.

The second bonding structure layer 221 includes a second dielectric layer 222, a second bonding layer 124 on the second dielectric layer 222, and a plurality of second bonding pads 226 formed in the second bonding layer 224 and the second dielectric layer 222. The top surfaces of the second bonding pads 226 are exposed from the second bonding layer 224. The bottom surfaces of the second bonding pads 226 are in direct contact with the conductive structures 220. The materials of the substrate 210, the interconnection layer 214, the conductive structures 220, the second dielectric layer 222, the second bonding layer 224, and the second bonding pads 226 may be referred to the materials of the substrate 110, the interconnection layer 114, the conductive structures 120, the first dielectric layer 122, the first bonding layer 124, and the first bonding pads 126 previously mentioned, and will not be repeated herein for the sake of simplicity. According to an embodiment of the present invention, the conductive structure 220 may include copper (Cu), the second dielectric layer 222 may include silicon oxide ($SiO_2$), the second bonding layer 224 may include silicon carbonitride (SiCN), the second bonding pad 226 may include copper (Cu). According to an embodiment of the present invention, at this process stage, the second bonding pad 226 may have a thickness T3. The top surface of the second bonding pad 226 may be approximately flush with the surface of the second bonding layer 224 at this stage.

Figure 4:
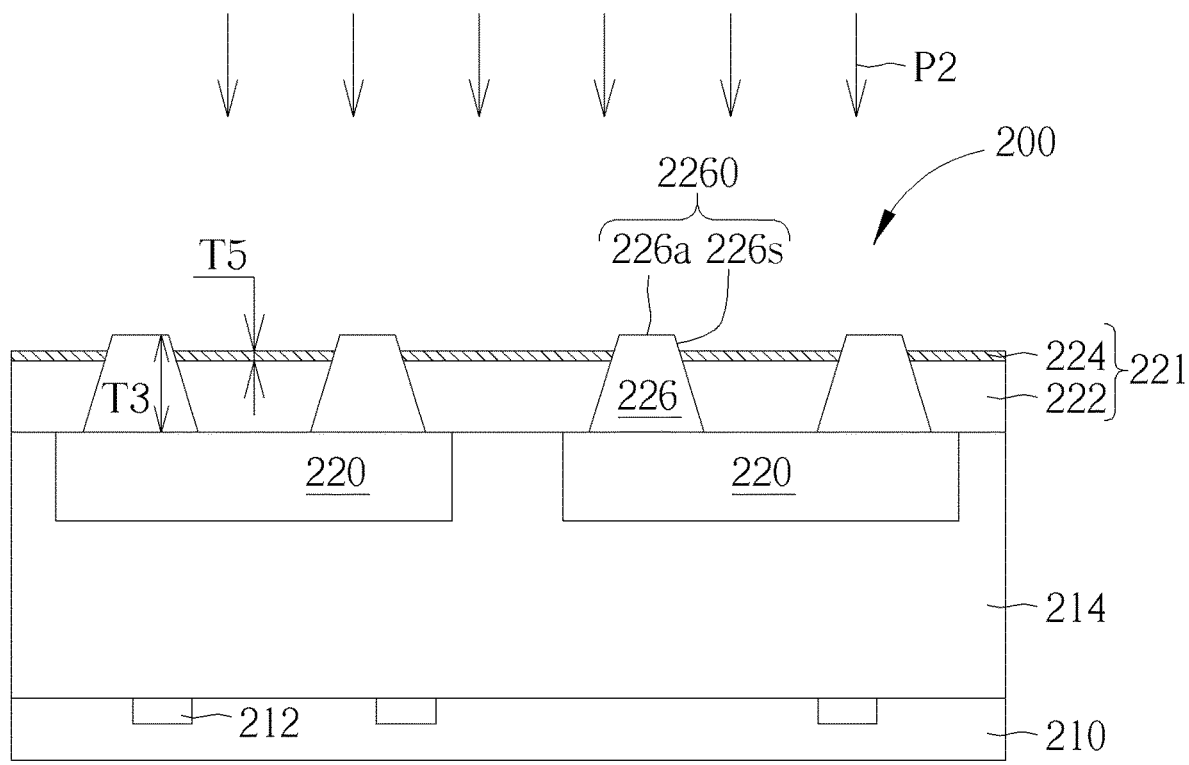

Please refer to FIG. 4. Subsequently, a removal process P2 is performed on the second device wafer 200 to remove a portion of the second bonding layer 224, so that a protruding portion 2260 of each of the second bonding pad 226 may protrude from the surface of the second bonding layer 224. The top surface 226a and the sidewall 226s of the protruding portion 2260 are exposed from the second bonding layer 224. The removal process P2 may be a wet etching process, a dry etching process, or a chemical mechanical polishing process that have etching selectivity between the materials of the second bonding pad 226 and the second bonding layer 224. According to an embodiment of the present invention, the removal process P2 is a wet etching process. When the second bonding layer 224 includes silicon carbonitride (SiCN), the removal process P2 may use phosphoric acid ($H_3PO_4$) to etch the second bonding layer 224. As shown in FIG. 4, after the removal process P2, the second bonding layer 224 may have a thickness T5, and the second bonding pad 226 may still have the thickness T3. The thickness T5 is smaller than the thickness T4 of the first bonding layer 124 shown in FIG. 2. The thickness T3 is larger than the thickness T2 of the first bonding pad 126 shown in FIG. 2.

Figure 5:
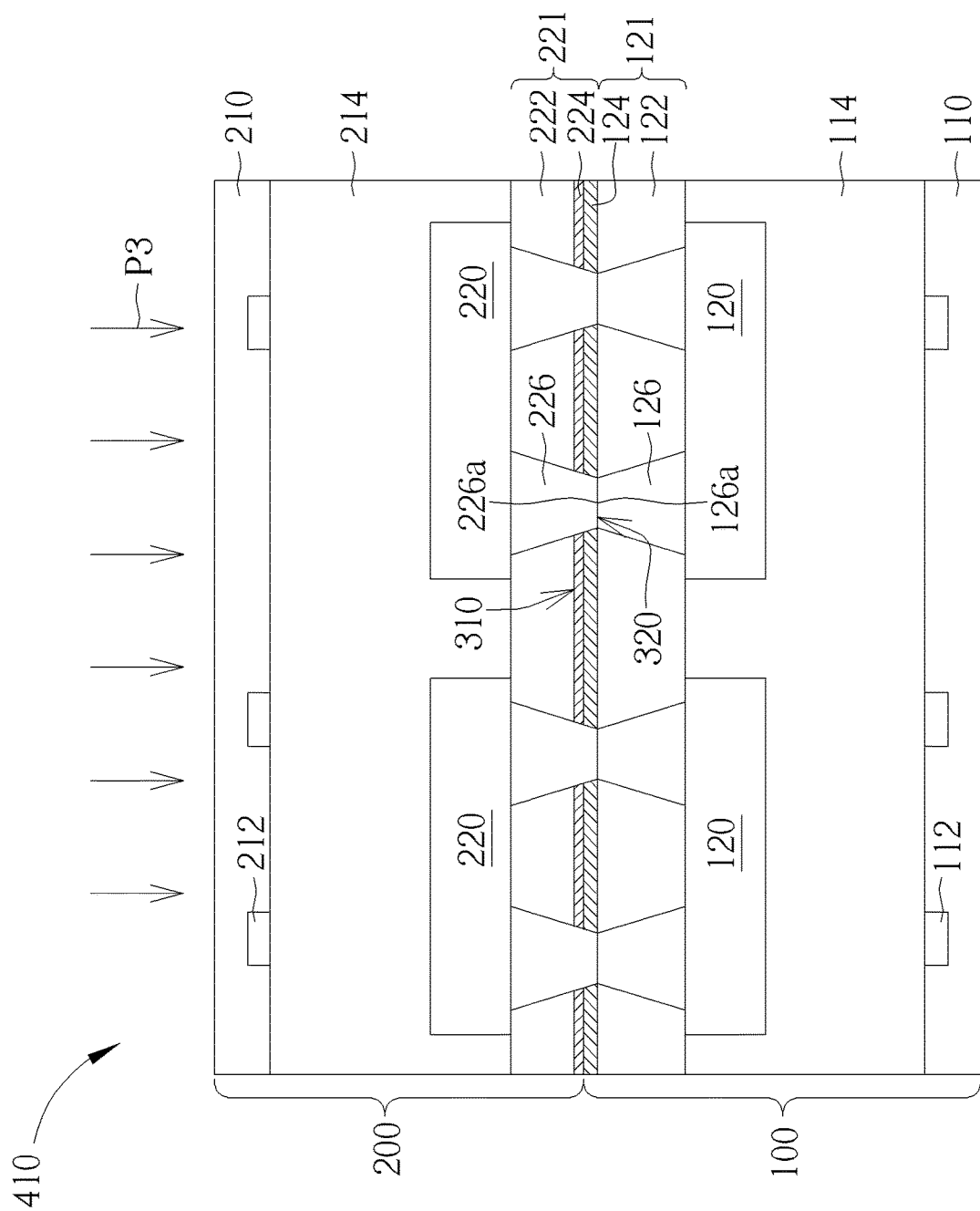
Figure 6:
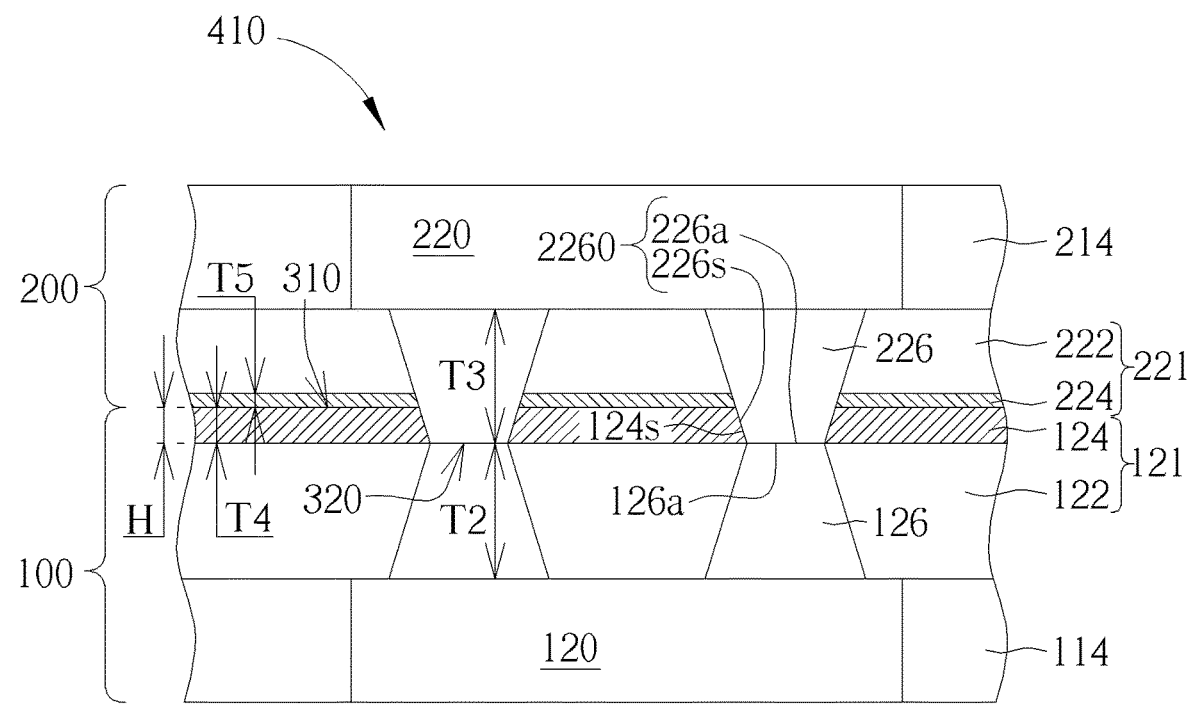
FIG. 6 is a partial enlarged view of the bonded semiconductor structure shown in FIG. 5.

Please refer to FIG. 5. Subsequently, a bonding process P3 is performed to bond the first device wafer 100 and the second device wafer 200, thereby a bonded semiconductor structure 410 may be produced.

The bonding process P3 may include performing an alignment step to arrange the first device wafer 100 and the second device wafer 200 in a way that the second bonding layer 224 and the first bonding layer 124 are face to face and in direct contact and the protruding portions 2260 of the second bonding pads 226 are aligned and placed into the corresponding recessed portions 130. After that, an anneal step of the bonding process P3 may be performed to promote formation of covalent bonds between the first bonding layer 124 and the second bonding layer 224 and diffusions between the metal materials of the first bonding pad 126 and the second bonding pad 226, thereby securely bonding the first device wafer 100 and the second device wafer 200 together. In some embodiments, the first device wafer 100 and the second device wafer 200 may be subjected to surface treatments before the bonding process P3 to remove surface particles and/or improve the bonding properties. According to an embodiment of the present invention, the process temperature of the anneal step of the bonding process P3 may be between 100° C. and 400° C., but is not limited thereto.

Please refer to FIG. 6. The bonded semiconductor structure 410 provided by the present invention includes a first device wafer 100 and a second device wafer 200 disposed on the first device wafer 100. The first device wafer 100 includes a first dielectric layer 112, a first bonding pad 126 formed in the first dielectric layer 112, and a first bonding layer 124 on the first dielectric layer 112. The second device wafer 200 includes a second dielectric layer 222, a second bonding layer 224 disposed on the second dielectric layer 222, and a second bonding pad 126 formed in the second dielectric layer 222 and extending through the second bonding layer 224 and the first bonding layer 124. The second bonding layer 224 is bonded with the first bonding layer 124 at a dielectric bonding interface 310. The second bonding pad 126 is bonded with the first bonding pad 126 at a conductive bonding interface 320.

More particularly, the present invention uses the protruding portions 2260 of the second device wafer 200 in conjunction with the recessed portions 130 of the first device wafer 100 to bond the device wafers, so that the dielectric bonding interface 310 and the conductive bonding interface 320 may have a step-height H. The height of the step-height H is related to the depth D1 (shown in FIG. 2) of the recessed portion 130. For example, in some embodiments where the depth D1 of the recessed portion 130 approximately equals to the thickness T4 of the first bonding layer 124, the height of the step-height H may approximately equal to the thickness T4 of the first bonding layer 124. In this embodiment, the width W3 of the recessed portion 130 may be controlled to allow the sidewall 124s of the first bonding layer 124 directly contacting the sidewall 226s of the protruding portion 2260 of the second bonding pad 226. By utilizing the concave/convex design of the protruding portions 2260 of the second bonding pads 226 and the recessed portions 130 located above the first bonding pads 126 to bond the first device wafer 100 and the second device wafer 200, a larger bonding process window which is able to tolerate the surface topography variations caused by uneven surface of the underlying interconnection layers and/or CMP loading effect may be achieved. In this way, an intimate contact and improved bonding quality between the first bonding pads 126 of the first device wafer 100 and the second bonding pads 226 of the second device wafer 200 may be achieved.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 7:
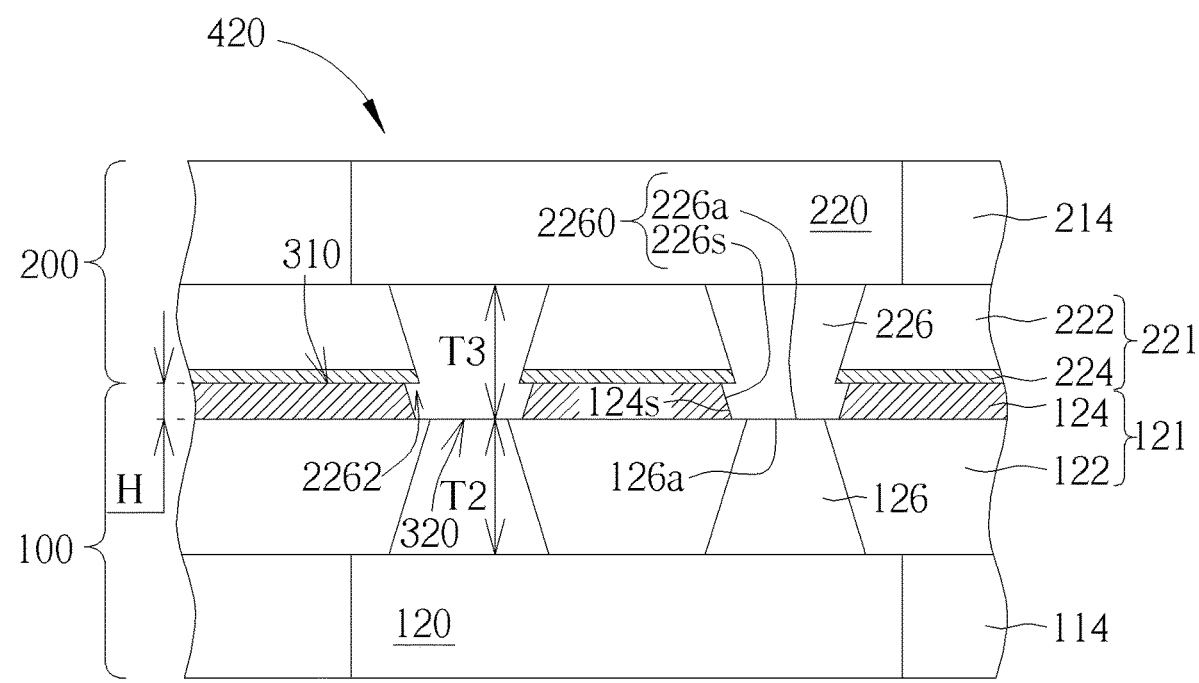
FIG. 7 is a schematic cross-sectional diagram showing a bonded semiconductor structure according to a second embodiment of the present invention.

FIG. 7 is a schematic cross-sectional diagram showing a bonded semiconductor structure 420 according to a second embodiment of the present invention. In this embodiment, the width W1 of the recessed portion 130 (shown in FIG. 2) may be larger than the width of the top surface 226a of the protruding portion 2260 of the second bonding pad 226. In this way, a larger space for thermal expansion of the metal material of the second bonding pad 226 during the anneal step of the bonding process P3 may be provided. As a result, after the bonding process P3, a step portion 2262 of the second bonding pad 226 adjacent to the dielectric bonding interface 310 may be formed by thermal expansion of the metal material of the second bonding pad 226, which may be helpful for securing the bonding between the first device wafer 100 and the second device wafer 200. Besides, the stress at the bonding interface caused by thermal expansion of the metal material of the second bonding pad 226 may be released, and the risk of metal extrusion and electrical shorting between bonding pads may be reduced. A larger alignment margin between the protruding portion 2260 and the recessed portion 130 may also be obtained.

Figure 8:
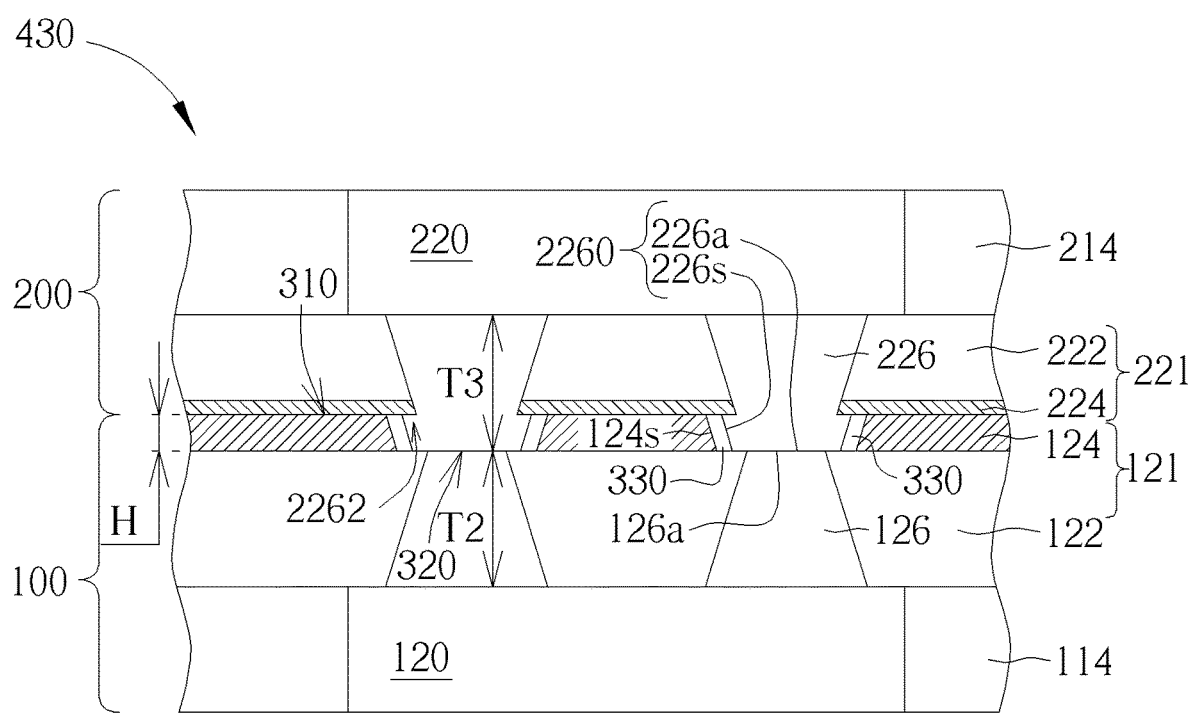
FIG. 8 is a schematic cross-sectional diagram showing a bonded semiconductor structure according to a third embodiment of the present invention.

FIG. 8 is a schematic cross-sectional diagram showing a bonded semiconductor structure 430 according to a third embodiment of the present invention. In this embodiment, the width W1 of the recessed portion 130 (shown in FIG. 2) may be much larger than the width of the top surface 226a of the protruding portion 2260 of the second bonding pad 226. Accordingly, after the bonding process P3, the thermal expanded protruding portion 2260 of the second bonding pad 226 may not completely fill the recessed portion 130. As shown in FIG. 8, an air gap 330 may be formed between the sidewall 226s of the protruding portion 2260 of the second bonding pad 226 and the sidewall 124s of the first bonding layer 124. The sidewall 226s and the sidewall 124s are spaced apart by the air gap 330. The air gap 330 may provide more stress buffer to the bonding interface between the first device wafer 100 and the second device wafer 200.

Figure 9:
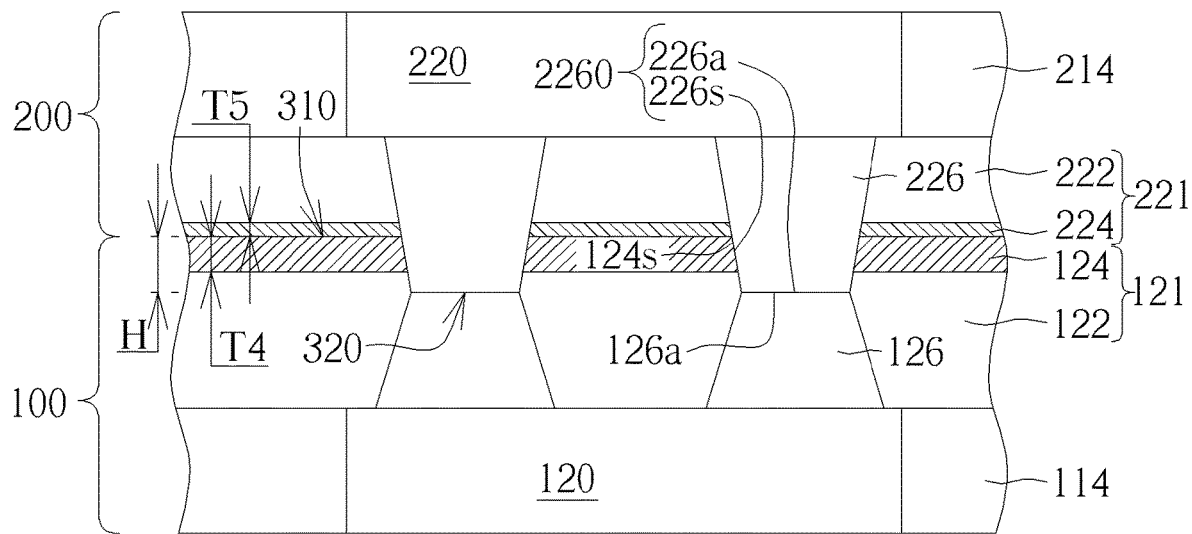
FIG. 9 is a schematic cross-sectional diagram showing a bonded semiconductor structure according to fourth embodiment of the present invention.
Figure 10:
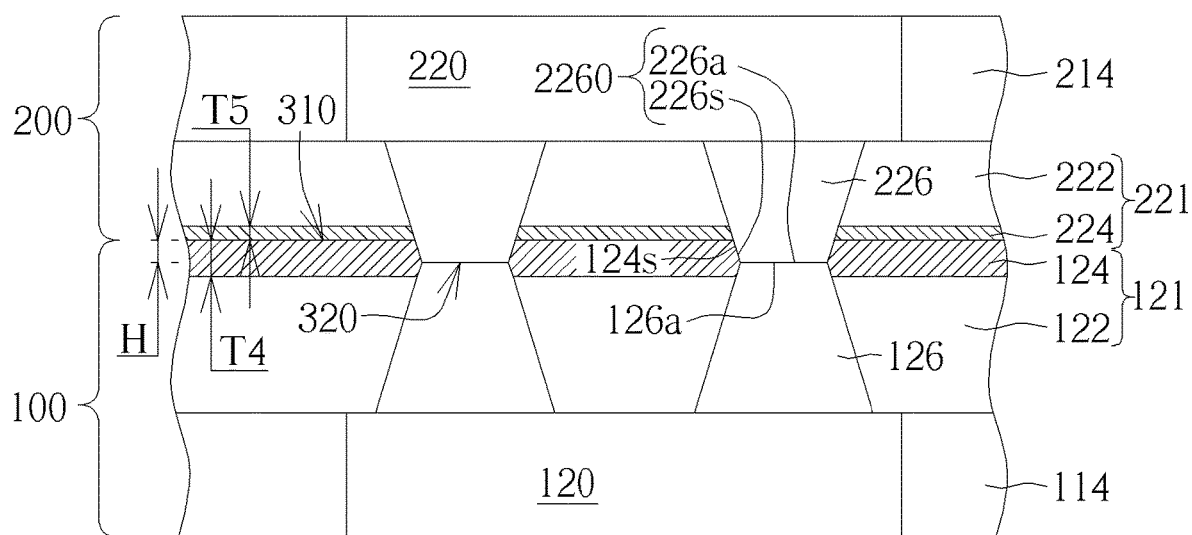
FIG. 10 is a schematic cross-sectional diagram showing a bonded semiconductor structure according to a fifth embodiment of the present invention.

FIG. 9 is a schematic cross-sectional diagram showing a bonded semiconductor structure 440 according to a fourth embodiment of the present invention. FIG. 10 is a schematic cross-sectional diagram showing a bonded semiconductor structure 450 according to a fifth embodiment of the present invention. As shown in FIG. 9, by controlling the removal process P1 to make the depth D1 of the recessed portion 130 (shown in FIG. 2) larger than the thickness T4 of the first bonding layer 124, the second bonding pad 226 of the bonded semiconductor structure 440 may pass through the entire thickness of the first bonding layer 124. The step-height H between the dielectric bonding interface 310 and the conductive bonding interface 320 may be larger than the thickness T4 of the first bonding layer 124.

On the other hand, as shown in FIG. 10, the depth D1 of the recessed portion 130 (shown in FIG. 2) may be smaller than the thickness T4 of the first bonding layer 124 after the removal process P1. Accordingly, the second bonding pad 226 of the bonded semiconductor structure 440 may only pass through a portion of the thickness T4 of the first bonding layer 124. The step-height H between the dielectric bonding interface 310 and the conductive bonding interface 320 may be smaller than the thickness T4 of the first bonding layer 124.

In light of the above, the bonded semiconductor structure provided by the present invention is formed by bonding the first device wafer and the second device wafer while the first bonding pads of the first device wafer are recessed from the surface of the first bonding layer of the first device wafer and in conjunction with the protruding portions of the second bonding pads protruding from the surface of the second bonding layer of the second device wafer. In this way, the problem of defective bonding between the bonding pads caused by uneven surface of the interconnection layer and/or recessed surface of the bonding pad may be prevented. The bonding quality and correct signal transmission between the first device wafer and the second device wafer may be guaranteed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a bonded semiconductor structure, comprising:
    providing a first device wafer and a second device wafer, wherein the first device wafer includes a first bonding layer and a first bonding pad exposed from the first bonding layer, the second device wafer includes a second bonding layer and a second bonding pad exposed from the second bonding layer;
    removing a portion of the first bonding pad until exposing a sidewall of the first bonding layer, wherein an angle between the sidewall of the first bonding layer and a top surface of the first bonding pad is larger than 90 degrees;
    removing a portion of the second bonding layer to expose a sidewall of the second bonding pad; and
    bonding the first device wafer and the second device wafer to form a dielectric bonding interface between the first bonding layer and the second bonding layer and a conductive bonding interface between the first bonding pad and the second bonding pad, wherein the conductive bonding interface and the dielectric bonding interface comprise a step-height.

2. The method for forming a bonded semiconductor structure according to claim 1, wherein the portion of the first bonding pad is removed by performing a chemical mechanical polishing process.

3. The method for forming a bonded semiconductor structure according to claim 1, wherein the portion of the second bonding layer is removed by performing a wet etching process.

4. The method for forming a bonded semiconductor structure according to claim 3, wherein the second bonding layer comprises silicon carbonitride (SiCN), and the wet etching process comprises using phosphoric acid ($H_3PO_4$).

5. The method for forming a bonded semiconductor structure according to claim 1, the sidewall of the first bonding layer directly contacts the sidewall of the second bonding pad after bonding the first device wafer and the second device wafer.

6. The method for forming a bonded semiconductor structure according to claim 1, the sidewall of the first bonding layer and the sidewall of the second bonding pad are spaced apart by an air gap.

\* \* \* \* \*